(12) United States Patent
Andry et al.

(10) Patent No.: US 8,487,425 B2
(45) Date of Patent: Jul. 16, 2013

(54) OPTIMIZED ANNULAR COPPER TSV

(75) Inventors: Paul S Andry, Yorktown Heights, NY (US); Mukta G Farooq, Hopewell Junction, NY (US); Robert Hannon, Wappingers Falls, NY (US); Subramanian S Iyer, Mount Kisco, NY (US); Emily R Kinser, Poughkeepsie, NY (US); Cornelia K Tsang, Mohegan Lake, NY (US); Richard P Volant, New Fairfield, CT (US)

(73) Assignee: International Business Machines Corporation, Armonk, NY (US)

( * ) Notice: Subject to any disclaimer, the term of this patent is extended or adjusted under 35 U.S.C. 154(b) by 93 days.

(21) Appl. No.: 13/167,107

(22) Filed: Jun. 23, 2011

(65) Prior Publication Data

US 2012/0326309 A1   Dec. 27, 2012

(51) Int. Cl.
  *H01L 23/04* (2006.01)
  *H01L 23/48* (2006.01)

(52) U.S. Cl.
  USPC ............................ 257/698; 257/773; 257/774

(58) Field of Classification Search
  USPC ................. 257/621, 686, 698, 773, 774, 777, 257/E25.012, E25.013
  See application file for complete search history.

(56) References Cited

U.S. PATENT DOCUMENTS

| | | | |
|---|---|---|---|
| 6,873,054 B2 * | 3/2005 | Miyazawa et al. | 257/774 |
| 7,276,787 B2 | 10/2007 | Edelstein et al. | |
| 7,741,226 B2 | 6/2010 | Andry et al. | |
| 7,863,189 B2 | 1/2011 | Basker et al. | |
| 7,964,972 B2 * | 6/2011 | Matsui | 257/774 |
| 2009/0032951 A1 | 2/2009 | Andry et al. | |
| 2010/0032764 A1 | 2/2010 | Andry et al. | |
| 2010/0044853 A1 | 2/2010 | Dekker et al. | |
| 2010/0164062 A1 | 7/2010 | Wang et al. | |
| 2010/0244247 A1 * | 9/2010 | Chang et al. | 257/741 |
| 2011/0079919 A1 | 4/2011 | Chaabouni et al. | |
| 2011/0095435 A1 | 4/2011 | Volant et al. | |

OTHER PUBLICATIONS

Kuan H. Lu, et al, "Thermo-Mechanical Reliability Challenges of 3D Interconnects", The University of Texas at Austin, SRC Project Review, Jun. 14, 2010, pp. 1-33.

(Continued)

*Primary Examiner* — Hung Vu
(74) *Attorney, Agent, or Firm* — Katherine S. Brown

(57) ABSTRACT

The present disclosure provides a thermo-mechanically reliable copper TSV and a technique to form such TSV during BEOL processing. The TSV constitutes an annular trench which extends through the semiconductor substrate. The substrate defines the inner and outer sidewalls of the trench, which sidewalls are separated by a distance within the range of 5 to 10 microns. A conductive path comprising copper or a copper alloy extends within said trench from an upper surface of said first dielectric layer through said substrate. The substrate thickness can be 60 microns or less. A dielectric layer having interconnect metallization conductively connected to the conductive path is formed directly over said annular trench.

15 Claims, 3 Drawing Sheets

OTHER PUBLICATIONS

Chongshen Song, et al, "A Wafer-Level 3D Integration Using Bottom-Up Copper Electroplating and Hybrid Metal-Adhesive Bonding", 2009 IEEE, pp. 163-164.

S.W. Ricky Lee, et al, "3D Stacked Flip Chip Packaging with Through Silicon Vias and Copper Plating or Conductive Adhesive Filling", 2005 IEEE, pp. 795-801.

J. Dukovic, et al, "Through-Silicon-Via Technology for 3D Integration", 2010 IEEE.

Sungdong Cho, "Technical Challenges in TSV Integration", Samsung Electronics Co. Ltd., Dec. 10, 2010, pp. 1-35.

Mukta Farooq, et al, "3D Copper TSV Integration, Testing and Reliability", IEDM 2011.

International Search Report/Written Opinion dated Feb. 26, 2013—for PCT/US2012/043052.

* cited by examiner

OPTIMIZED ANNULAR COPPER TSV

FIELD OF THE INVENTION

This invention relates generally to a through substrate via (TSV) in an integrated circuit, more specifically to a TSV in a three-dimensional integrated circuit having at least two substrates vertically stacked.

BACKGROUND OF THE INVENTION

In order to continue to improve performance and functionality of integrated circuits, the industry has recently been developing technology to enable vertical integration of semiconductor device chips, known generally as three-dimensional (3D) stacking technology. The stacked substrates may be full or partial wafers, each typically having multiple chips. A 3D stack can be diced after bonding to separate the units, each unit having two or more chips vertically bonded together. Typically, a semiconductor chip includes several layers of integrated circuitry (e.g., processors, programmable devices, memory devices, etc.) built on a semiconductor substrate. A top layer of the bonded stack may be connected to a bottom layer of the stack utilizing through substrate interconnects or vias (TSVs). Formation of the TSV is recognized as a particular challenge (see e.g., Dukovic, et. al., Through-Silicon-Via Technology for 3D Integration).

Among other issues, a via extending through a semiconductor substrate must generally have a high aspect ratio. Forming such a deep feature without damaging the remaining substrate, and then forming a conductive path within the deep feature that is electrically insulated from the substrate is extremely difficult. Some have proposed to etch the hole in the substrate, and then expose the substrate to very high temperatures whereby an oxide layer is formed over the entire exposed surfaces that is a reliable insulating layer. Such temperatures are incompatible with CMOS BEOL (back-end-of-the-line) processing, so such forming an oxide layer must be done in a "via first" scheme before any semiconductor devices (FEOL) or interconnect wiring (BEOL) are formed (see Andry et al, US 2010/0032764). Copper is preferred for TSVs due to its high conductivity. However, 'via first' schemes are problematic with copper vias because semiconductor devices are highly susceptible to damage as a result of copper migration into the substrate.

Copper is more compatible with back end or 'via middle' processing, but the thermal expansion mismatch between the copper of a TSV and the surrounding materials can create excessive thermal stress and cause cracking Edelstein et al., U.S. Pat. No. 7,276,787 ("the '787"), suggests to address this problem by utilizing an annular TSV. Specifically, the '787 teaches to etch a large hole, form a series of layers on the sidewalls without filling the hole (e.g., electrical insulator, various barrier layers, a conductive layer, and further isolation layers). Finally, the core of the hole can be filled by a material selected to have thermal characteristics similar to the substrate such that overall structure has an effective CTE which closely matches the CTE and elastic modulus of the substrate.

However, even an annular copper TSV tends to extrude when subjected to thermal cycling during CMOS BEOL processing (see, e.g., Cho, "Technical Challenges in TSV Integration"). Extrusion by a TSV can stress overlying metallization layers, weakening or shorting any embedded interconnect wiring. Cho provides SEM photographs showing extrusion of a copper TSV resulting from exposure to process temperatures for formation of interconnect metallization (BEOL). The damage caused by such extrusion is depicted in FIGS. 1A and 1B. FIG. 1A shows that the copper core of a solid TSV 110 has extruded above the CMP'd surface 104 of passivation layer 102, lifting overlying layers 120 and stressing the interconnect wiring 122 embedded therein. FIG. 1B illustrates crack 105 through the inner core and crack 106 initiating at the lower inner corners of annular copper TSV 130. Cho recommends to minimize copper extrusion by forming the via last.

While 'via last' processing generally proceeds at temperatures low enough to avoid copper extrusion, 'via last' consumes the entire TSV footprint though all BEOL layers, making it is far less efficient for purposes of process integration and chip design. It would be highly advantageous to identify a technique to form a reliable copper TSV that could be formed during BEOL processing.

SUMMARY OF THE INVENTION

In one aspect of the invention, a TSV structure is provided, which TSV can be formed during BEOL processing and can tolerate exposure to further BEOL processing.

In one embodiment of the present invention, an integrated circuit structure that includes a TSV is provided. The structure includes a substrate having at least one semiconductor device formed in a top surface, and a first dielectric layer deposited on such top surface. The TSV constitutes an annular trench which extends through the substrate and the first dielectric layer, wherein the substrate defines the inner and outer sidewalls of the trench, which sidewalls are separated by a distance within the range of 5 to 10 microns. A conductive path comprising copper or a copper alloy extends within said trench from an upper surface of said first dielectric layer through said substrate, which can have a thickness of 90 microns or less. A second dielectric layer having interconnect metallization conductively connected to the conductive path is formed directly on said first dielectric layer and overlying said annular trench. The inside diameter of the trench can be in the range of 4 to 9 microns. The sidewall separation can be within the range of 5.5 and 9 microns and the inside diameter of the trench can be in the range of 5 to 8 microns. The sidewalls can have a slight slope, which can be within 85 and 90 degrees relative to said top surface, with a preferred range between 87 and 90 degrees. The conductive path can have average grain size above 2 microns. A dielectric liner having a thickness in the range of 0.4 to 1.5 microns can separate the conductive path from the substrate.

In an embodiment of the present invention, an integrated circuit (IC) is provided, which includes a semiconductor substrate having at least one semiconductor device formed in a top surface thereof and a first dielectric layer over said top surface. The IC further includes an annular trench extending from an upper surface of the first dielectric layer to a bottom surface of the substrate, such annular trench having an inner sidewall defining a substrate core having a diameter at said top surface between 5 and 8 microns, where the inner sidewall is sloped between 85 and 90 degrees relative to said top surface. The IC includes a conductive path within the annular trench which path is isolated from said semiconductor substrate by a dielectric liner. The IC includes a second dielectric layer containing interconnect metallization conductively connected to said at least one semiconductor device and overlying the annular trench. In embodiments, the conductive path comprises copper or a copper alloy and the semiconductor substrate comprises monocrystalline silicon. The dielectric liner can have a thickness near the bottom of the trench at least 50 percent of that near the top surface. The dielectric liner can be formed by a combination of SACVD and PECVD, and can have a dielectric constant, or k-value, of 5 or less.

According to another embodiment of the present invention, a method to form a robust TSV structure is provided. The method includes forming an annular trench in a substrate, where the substrate includes at least one semiconductor device formed in a top surface thereof, and the trench has an inner sidewall and an outer sidewall separated by less than 10 microns and extends to a depth of 90 microns or less. The method includes lining said inner and outer sidewalls with a conformal dielectric liner, filling said trench with conductive material comprising copper or a copper alloy; and annealing said filled trench above 350° C. for at least 20 minutes. The anneal can proceed at a temperature between 350 and 430° C., and can extend for an hour or more. Embodiments of the method can include forming the annular trench through at least one BEOL layer disposed over said top surface and forming a second BEOL layer on the at least one BEOL layer and over said annular trench. The method can further comprise back-side thinning of the substrate to expose said conductive material of said filled trench.

BRIEF DESCRIPTION OF THE DRAWINGS

The exemplary embodiments, both as to organization and method of operation, may best be understood by reference to the detailed description which follows taken in conjunction with the accompanying figures.

DETAILED DESCRIPTION OF THE INVENTION

Figure 1A:
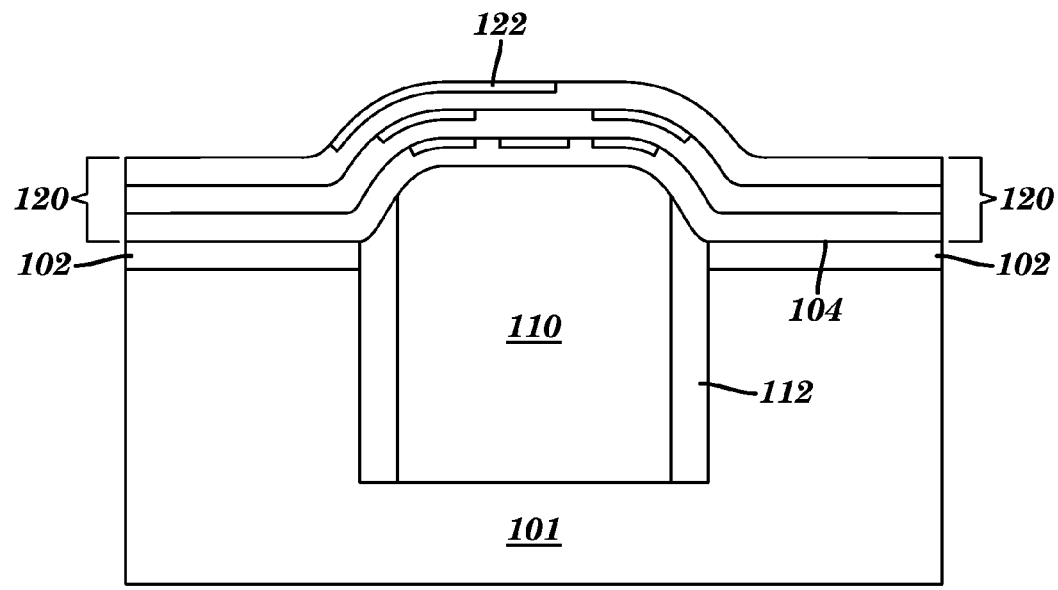
FIGS. 1A and 1B illustrate damage caused by a conventional TSV exposed to CMOS processing.
Figure 1B:
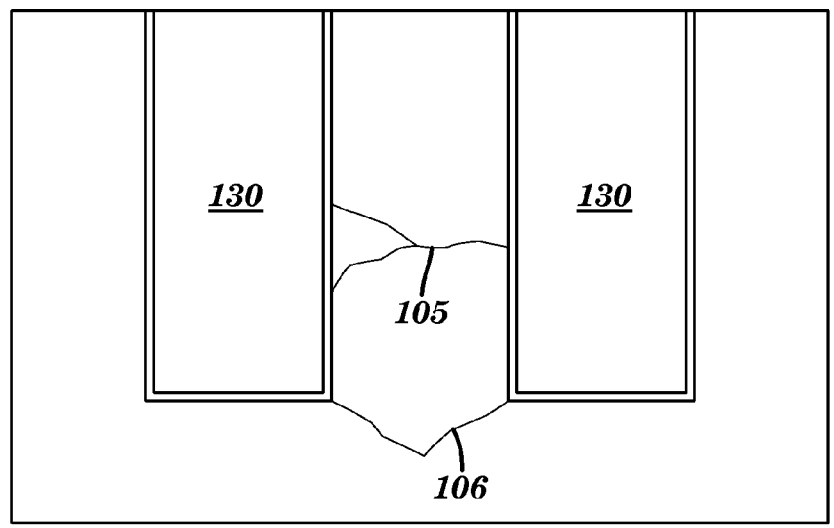

The present disclosure provides a thermo-mechanically reliable copper TSV and a technique to form such TSV during BEOL processing, which is now described in detail with accompanying figures. It is noted that like reference numerals refer to like elements across different embodiments. The drawings are not necessarily drawn to scale.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

As noted, the present invention identifies a TSV structure and a method of reliably forming the same, which structure can withstand CMOS BEOL thermal cycling without cracking surrounding materials, thereby providing for a reliable 3D integrated circuit.

Figure 2A:
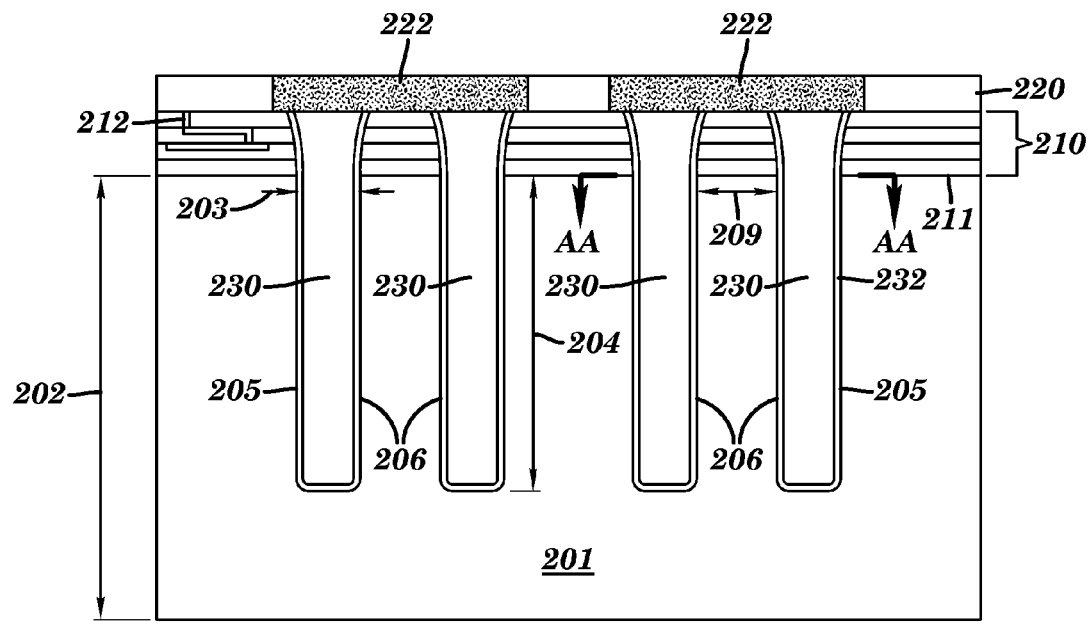
FIG. 2A is a vertical section view of an annular TSV according to the present disclosure.

Referring now to FIG. 2A, there is illustrated a semiconductor substrate 201 having an initial thickness 202. One or more semiconductor devices (not shown) can be formed in and on top surface 211 of the substrate. One or more dielectric layers 210 can be deposited over top surface 211. Annular trench 230 can be formed through dielectric layers 210, extending through top surface 211 and into substrate 201 utilizing conventional back-end compatible lithography and etching. Typically, trench 230 is formed by a Bosch etch which proceeds by alternating between anisotropic reactive ion etch and polymer deposition steps, but the invention is not so limited. Annular trench 230 does not at this point contact another feature at its bottom end, so it can be referred to as a 'blind via'.

The substrate herein may comprise any semiconductor such as Si, SiGe, SiGeC, SiC, Ge alloys, GaAs, InAs, InP and other III/V or II/VI compound semiconductors. In addition to these listed types of semiconducting materials, the present invention also contemplates cases in which the semiconductor substrate is a layered semiconductor such as, Si/SiGe, Si/SiC, silicon-on-insulators (SOIs) or silicon germanium-on-insulators (SGOIs). Further, substrate 201 can be single crystalline, polycrystalline, amorphous, or have a combination of at least two of a single crystalline portion, a polycrystalline portion, and an amorphous portion. In a preferred embodiment, substrate 201 comprises a single crystalline silicon portion.

Dielectric layer 210 can include a passivation layer, comprising, e.g., SiO2, disposed directly on the semiconductor substrate. Optionally, dielectric layer 210 can include one or more additional layers comprising a combination of dielectric and conductive materials 212, e.g., one or multiple BEOL interconnect levels of a multilayered interconnect structure, disposed over the passivation layer. Dielectric layer 210 can be formed by one or combinations of any dielectric material known in the art such as organic insulator (e.g., polyimide), inorganic insulator (e.g., silicon nitride or silicon dioxide), low-K dielectric such as SiLK™, doped or undoped silicate glass, organosilicate, BLoK™, NBLoK™, thermosetting polyarylene ethers (referring to aryl moieties or inertly substituted aryl moieties which are linked together by bonds, fused rings, or inert linking groups such as, for example, oxygen, sulfur, sulfone, sulfoxide, carbonyl and the like), or any other type of dielectric material that can be deposited or formed on a substrate. In embodiments, the dielectric material has a k-value of 5 or less.

Referring again to FIG. 2A, the length 204 of annular trench 230 is less than the initial thickness 202 of substrate 201. Length 204 can be less than 90 microns and preferably is in the range of 60 microns or less. At top surface 211, the width 203 of the annular trench, that is the separation of inner sidewall 206 and outer sidewall 205, is within the range of 5 to 10 microns. Preferably the inner and outer sidewalls of the annular trench at top surface 211 are separated by a distance within the range of 5.5 to 9 microns.

Figure 2B:
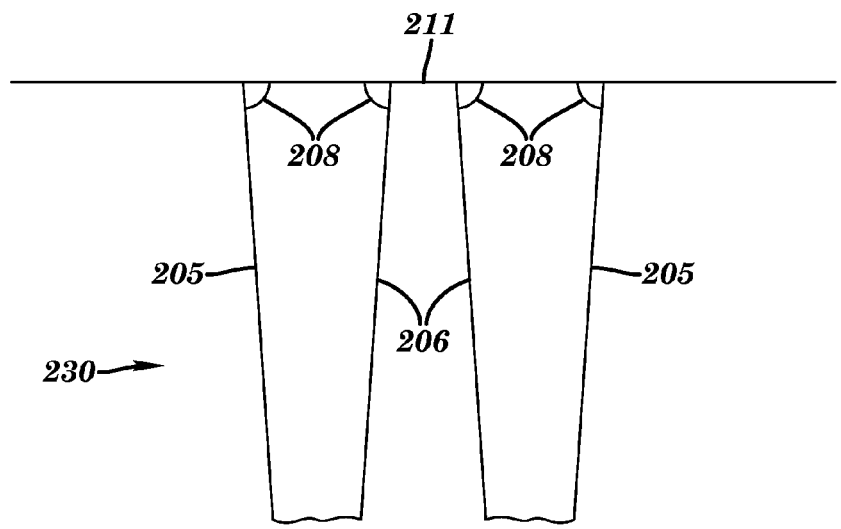
FIGS. 2B and 2D are detail views of a TSV according to the present disclosure.

The etch process to form annular trench 230 can form nominally straight sidewalls, though the sidewalls may actually have a scalloped contour, each 'scallop' corresponding to a single etch/polymer deposition cycle of a Bosch process. The height variation along the sidewall surface or 'roughness' is preferably minimal, such as between 0 and 0.5 micron. More particularly, for a given vertical length of a single scallop 'S', the width of said trench differs by less than 10 percent, i.e., less than or equal to 0.2*S (accounting for 10 percent variability on both sidewalls). The sidewalls can be perpendicular to top surface 211 or can be slightly sloped. Referring to FIG. 2B, sidewalls 205 and 206 can have the same slope relative to generally planar top surface 211, but it is not necessary that 205 and 206 have the same slope. Each sidewall and the top surface 211 preferably form an angle 208 in the range of 87 to 90 degrees. According to embodiments of the present invention, sidewalls 205 and 206 angle toward the center of the trench such that annular via 230 narrows with depth.

Figure 2C:
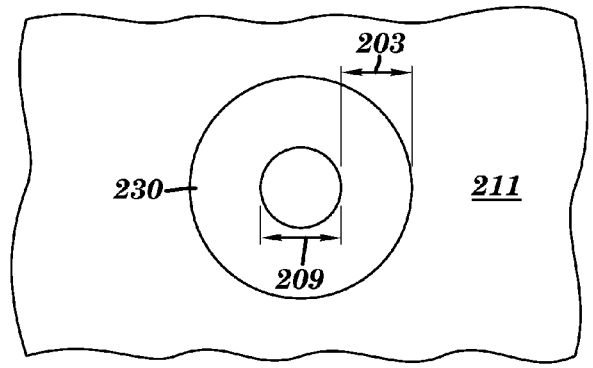
FIG. 2C is a cross section at AA of a TSV of FIG. 2A.

FIG. 2C is a section view at AA of FIG. 2A. Annular trench 230 defines an inner substrate core which can have a circular cross section such that the core constitutes a generally cylindrical shape. The diameter 209 of the substrate core at top surface 211 can be in the range of 4 to 9 microns and preferably is in the range of 5 to 8 microns. The outside diameter 219 of annular trench 230 at top surface 211 can be in the range of 18 to 25 microns, and preferably is in the range of 19 to 23 microns.

Figure 2D:
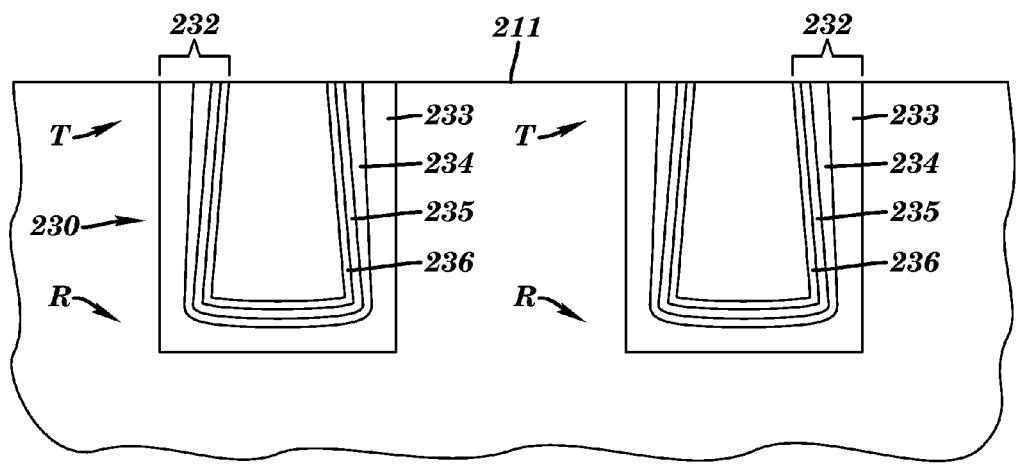

A magnified view of layer 232 is illustrated in FIG. 2D. Layer 232 includes an insulating liner 233, and can also include several other layers for various functions such as to prevent diffusion. Insulating liner 233 can have high conformality and can be formed, for example, by sub-atmospheric CVD (SACVD) deposition of SiO2 or by deposition of a flowable oxide. In certain embodiments, insulating layer 233 is between 0.4 and 1.5 micron thick at the first (or top) end "T". Insulating liner 233 can be formed on the sidewalls of the annular trench 230 so that the thickness on sidewalls adjacent to the remote end "R" relative to the thickness on sidewalls adjacent to top surface 211 is at least 50 percent or between 65 percent and 100 percent. In embodiments, insulating liner 233 can have a k-value of 5 or less.

A dielectric cap 234 can be formed to protect insulating liner 233. In embodiments, an oxide cap 234 can be formed to fully cover insulating liner 233 within trench 230. Cap layer 234 can be formed by plasma enhanced CVD (PECVD) to a nominal thickness between 1000 and 5000 Å measured on the sidewalls adjacent to top surface 211, and thickness at the remote end at least 15 percent or in the range of 20 percent to 30 percent of the nominal thickness.

Layer 232 can include one or more barrier or adhesion layers 235. A barrier layer can, for example, comprise Ta, TaN, Ti, TiN, Ru, RuN, RuTa, RuTaN, W, WN or any other material that can serve as a barrier to prevent a conductive material from diffusing there through. The actual barrier materials can be selected based on materials of the conductive TSV core (e.g., copper) and the insulating liner 233. In certain embodiments, a barrier 235 can formed by deposition of Ta/TaN at a thickness between 20 to about 500 Å with a thickness from about 50 to about 200 Å being more typical. The diffusion barrier can be formed by known methods such as plasma enhanced CVD (PECVD), ALD, PVD, sputtering, chemical solution deposition or plating. For plating, layer 232 will also include a seed layer 236. For a copper TSV, seed layer 236 can be formed by conventional processes, for example, by PVD or ALD, to a thickness within the range of 1000 to 9000 Å or in the range of 1500 to 8000 Å.

A void-free fill process, such as available from Novellus or Nexx, can be used to fill TSV with copper. The conductive fill may comprise copper or any other conductive metal, an alloy comprising at least one conductive metal, a conductive metal silicide or combinations thereof. Preferably, the conductive material is a conductive metal such as Cu, W or Al, with Cu or a Cu alloy (such as AlCu) being highly preferred in the present invention. The fill process can be controlled to result in minimal over burden. Optionally, overburden can be reduced to about 2 microns or less using a chemical wet etch.

The structure is then annealed to increase the average grain size to above 2 microns or to a size in the range of 3 to 5 microns. The anneal can proceed at temperature above 300° C. The structure can be maintained at high temperature for over 15 minutes or in the range of 20 to 120 minutes. In some embodiments, the structure is maintained in the range of 335 to 410° C. for at least 50 minutes. The structure can be maintained in the range of 350 to 430° C. for 20 to 100 minutes.

After annealing, the remaining overburden can be removed. Typically, the overburden is removed by CMP followed by polishing. Optionally further BEOL layers can be formed by conventional BEOL processing over the top end of the TSV. A structure can be attached to the top side to enable wafer handling. The backside can be ground or etched to a thickness of 60 to 90 microns or less so the bottom end of the TSV is exposed, followed as desired by forming backside connections to the TSV, including e.g., passivation and contact pads.

Example 1

Annular copper plated TSVs were integrated with minimal process complexity to maximize wireability. Blind vias of less than 100 microns depth, at a minimum pitch of 50 microns, with near vertical sidewalls, were made by Bosch process. A deposited conformal oxide, with excellent coverage at the bottom of the TSV, was used for insulation. Sputter deposition was used for a barrier and seed layer, then bottom-up void-free copper plating, anneal and CMP to remove the minimal plated overburden. A thick Cu wiring level takes advantage of the lower voltage drops observed with TSV's but results in additional bowing. A process that incorporates a highly compressive ILD film was used at key via levels to compensate for the increased bow. Completed wafers were bonded to glass handlers and thinned by grind, polish, RIE. PECVD oxide/nitride was deposited. After CMP to expose the TSV metal, copper was electrodeposited and a backside redistribution level was defined. The wafers were diced and assembled on organic laminates using die level C4 joining Reliability testing was performed. A thin (<1000 A) SiN cap (top side) layer remained intact after a 399° C. soak. Tests for ILD damage found no change in the leakage between wiring levels after thermal cycling between −65 C and 150° C. for 500 cycles. Thermal cycling also showed no degradation in TSV resistance or functionality of devices proximate to the TSV.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. An integrated circuit structure comprising:
    a substrate having at least one semiconductor device formed in a top surface thereof, and a first dielectric layer deposited over said top surface;
    an annular trench through said first dielectric layer and extending through said substrate, wherein said substrate constitutes inner and outer sidewalls of said trench, said inner and outer sidewalls separated by a distance within the range of 5 to 10 microns;
    a conductive path within said trench and extending from an upper surface of said first dielectric layer through said substrate, said path comprising copper or a copper alloy;
    a second dielectric layer containing interconnect metallization, said interconnect metallization conductively connected to said conductive path, said second dielectric layer formed directly on said first dielectric layer and overlying said annular trench.

2. The structure of claim 1 wherein the thickness of said substrate is 60 microns or less.

3. The structure of claim 1 wherein said inner sidewall defines a substrate core having a diameter at said top surface in the range of 4 to 9 microns.

4. The structure of claim 3 wherein said inner and outer sidewalls are separated by a distance within the range of 5.5 and 9 microns and said diameter is in the range of 5 to 8 microns.

5. The structure of claim 1 wherein said inner and outer sidewalls slope in at an angle within 85 and 90 degrees relative to said top surface.

6. The structure of claim 1 wherein said conductive path has average grain size greater than 2 microns.

7. The structure of claim 1 further comprising a dielectric liner separating said conductive path from said substrate, said liner having a thickness in the range of 4000 to 10000 Å.

8. An integrated circuit comprising:
a semiconductor substrate having at least one semiconductor device formed in a top surface thereof;
an annular trench extending from said top surface to a bottom surface of said semiconductor substrate, said annular trench having an inner sidewall defining a core of said semiconductor substrate, said core having a diameter at said top surface between 5 and 8 microns, said inner sidewall sloped between 87 and 90 degrees relative to said top surface;
a conductive path within said annular trench, said conductive path isolated from said semiconductor substrate by a dielectric liner;
a dielectric layer containing interconnect metallization conductively connected to said at least one semiconductor device, said dielectric layer overlying said annular trench.

9. The structure of claim 8 wherein said conductive path comprises copper or a copper alloy and said semiconductor substrate comprises monocrystalline silicon.

10. The structure of claim 8 wherein said dielectric liner has a thickness on said inner sidewall, said thickness near said bottom surface being at least 50 percent of said thickness at said top surface.

11. The structure of claim 10 wherein said dielectric liner at said top surface has a thickness between 400 and 1500 nanometers.

12. The structure of claim 8 wherein said dielectric liner comprises SACVD oxide.

13. The structure of claim 8 wherein said dielectric liner is formed by a combination of SACVD and PECVD.

14. The structure of claim 8 wherein the outside diameter of said trench is between 17.5 and 25 microns at said top surface.

15. The structure of claim 14 wherein said outside diameter of said trench is between 19 and 23 microns at said top surface.

* * * * *